United States Patent [19]
Nojiri et al.

[11] Patent Number: 5,257,224
[45] Date of Patent: Oct. 26, 1993

[54] SEMICONDUCTOR DEVICE WITH MULTIPLE LAYERS OF MEMORY CELL ARRAYS

[75] Inventors: Isao Nojiri; Masahide Kaneko, both of Hyogo, Japan

[73] Assignee: Mitsubishi Denki Kabushiki Kaisha, Tokyo, Japan

[21] Appl. No.: 751,933

[22] Filed: Sep. 3, 1991

[30] Foreign Application Priority Data

Sep. 5, 1990 [JP] Japan .................. 2-238693

[51] Int. Cl.⁵ .............. H01L 27/08; H01L 27/10
[52] U.S. Cl. .................. 365/175; 365/117; 257/67; 257/910; 257/70
[58] Field of Search .......... 365/175, 117, 182; 257/67, 910, 74, 70

[56] References Cited

U.S. PATENT DOCUMENTS 4,972,370 11/1990 Morimoto et al. .......... 365/175
5,170,227 12/1992 Kaneko et al. .......... 257/67

FOREIGN PATENT DOCUMENTS 61-1904 1/1986 Japan .
63-137471 6/1988 Japan .

*Primary Examiner*—Eugene R. LaRoche
*Assistant Examiner*—Viet Q. Nguyen
*Attorney, Agent, or Firm*—Lowe, Price, LeBlanc & Becker

[57] ABSTRACT

A plurality of strip shaped first polysilicon layers 3 are formed on a monocrystalline silicon substrate 1, a plurality of strip shaped second polysilicon layers 5 are formed thereon crossing the first polysilicon layers 3, and a plurality of strip shaped third polysilicon layers 8 are further formed thereon crossing the second polysilicon layers 5. The first and second polysilicon layers 3 and 5 are laser-annealed and monocrystallined. Contact holes 4 and 7 are selectively formed at the crossing points of the first polysilicon layers 3 and the second polysilicon layers 5, and the crossing points of the second polysilicon layers 5 and the third polysilicon layers 8. A PN junction is formed on each surface layer of the first polysilicon layers 3 and the second polysilicon layers 5 in the portions corresponding to these contact holes 4 and 7. Two layers of memory cell arrays using diode elements as memory cells are piled upon each other.

3 Claims, 4 Drawing Sheets

FIG. 3A PRIOR ART
FIG. 3C PRIOR ART
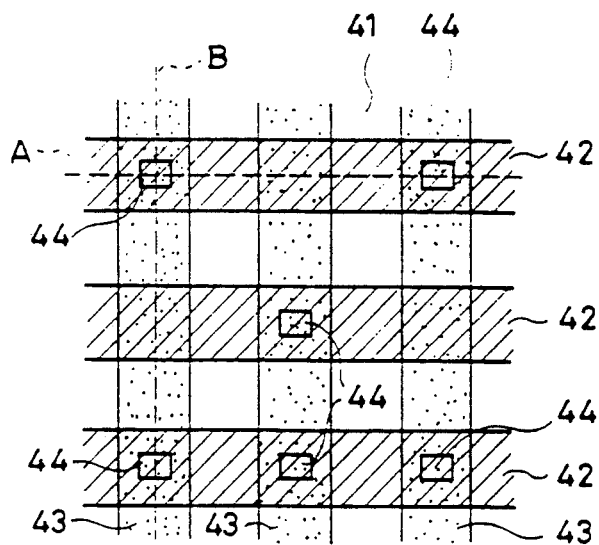
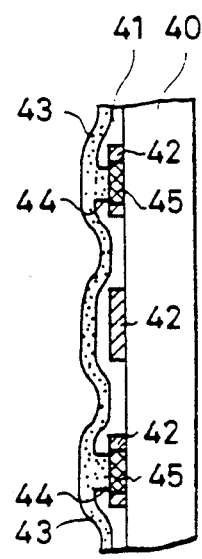
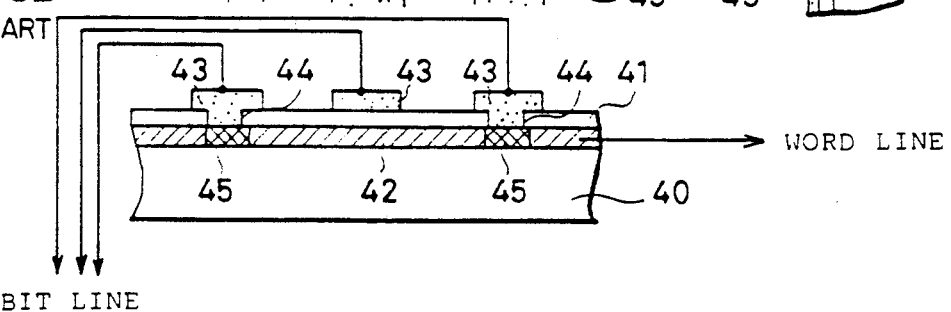
FIG. 3B PRIOR ART

SEMICONDUCTOR DEVICE WITH MULTIPLE LAYERS OF MEMORY CELL ARRAYS

BACKGROUND OF THE INVENTION

1. Field of the Invention

The present invention relates generally to a semiconductor memory device, and more particularly to improvements on a memory cell array in a mask ROM.

2. Description of the Background Art

Memory ICs in wide use today can be largely classified into an RWM (Read Write Memory) to and from which writing and reading can be performed after its fabrication, and an ROM (Read Only Memory) used exclusively for reading to which writing is not possible after its fabrication. Among the two types, the ROM memory is used for storing fixed information such as character patterns, etc. because stored information is not erased when power is off. The ROMs further include an EPROM (Erasable and Programmable ROM) capable of changing stored information electrically after its fabrication, and capable of erasing stored information by radiation of ultra violet rays, etc., and a mask ROM which information is written in at the time of manufacturing and the stored information can not be changed. The mask ROM is often used for storing fixed data such as character patterns for a CRT display and BASIC programs for a personal computer.

The memory part of a mask ROM commercially available at present generally includes a plurality of MOS transistors arranged in a matrix. The MOS transistor is used as a memory cell. Three areas for source, drain and gate are necessary when an MOS transistor is formed on a semiconductor substrate. The size of each of these three regions must be sufficient for achieving functions as an MOS transistor, and therefore can not be reduced limitlessly. When the MOS transistor is used as a memory cell, miniaturization of the entire area occupied by the memory naturally has its limit, and, therefore, recent demands for miniaturization of semiconductor integrated circuit devices can not be satisfied. Especially as the storage capacity of a mask ROM increases, the more serious will be this problem of meeting the demands. Meanwhile, demands for the larger storage capacities of memory ICs including the mask ROM have been even more prevalent in recent years.

Use of a mask ROM using elements of diode structure in place of elements of MOS structure is proposed for solving the above-mentioned problem (see, for example, Japanese Patent Publication No. 61-1904, and Japanese Patent Laying-Open No. 63-137471).

FIGS. 3A to 3C are schematic views each showing a structure of a memory cell array of an improved mask ROM shown in Japanese Patent Publication No. 61-1904. FIG. 3A is a plan view, FIGS. 3B and 3C are sectional views of the memory cell array shown in FIG. 3A taken along dotted lines A and B, respectively. Referring to these figures, the memory cell array is formed on a semiconductor substrate of monocrystalline silicon 40. The substrate 40 has on its surface an insulating film (not shown) formed of a silicon oxide film. A plurality of strip shaped N type polysilicon layers 42 are provided in parallel to each other on the substrate. An insulating layer 41 is formed entirely on the semiconductor substrate 40 including the polysilicon layers 42. The insulating layer 41 is selectively provided with openings, i.e. contact holes 44. By introducing an impurity into the polysilicon layer 42 under the contact holes, P type polysilicon regions 45 are formed. A plurality of strip shaped conductive layers 43 parallel to each other are provided on the insulating film 41 and the contact holes 44 crossing the polysilicon layers 42. The contact holes 44 are selectively provided at the crossing points of the polysilicon layers 42 and the conductive layers 43. The strip shaped polysilicon layers 42 each correspond to word lines different from each other, and the strip shaped conductive layers 43 each correspond to bit lines different from each other.

As can be seen from FIG. 3A, the crossing points of the plurality of strip shaped polysilicon layers 42 and the plurality of strip shaped conductive layers 43 constitute a matrix. Referring to FIGS. 3B and 3C, among these crossing points, PN junctions are formed in the polysilicon layers 42 under the contact holes 44, only in the ones provided with the contact holes 44. If forward voltage is applied to the conductive layer 43 at the crossing point provided with the contact hole 44, current flows through the polysilicon layer 42. On the other hand, if forward voltage is applied to the conductive layer 43 at the crossing point without the contact hole 44, current does not flow through the polysilicon layer 42, because the conductive layer 43 and the polysilicon layer 42 are insulated by the insulating layer 42. By applying a prescribed voltage to a selected bit line and determining the presence or absence of current flowing through a selected word line, it can be determined whether the contact hole is provided at the crossing point of the conductive layer 43 corresponding to the selected bit line and the polysilicon layer 42 corresponding to the selected word line. It is therefore possible to read stored information from a mask ROM after it is manufactured as practiced conventionally, if the memory cell array of the mask ROM is manufactured by making logical values "1" and "0" correspond to the presence and absence of the contact hole and by determining the formation pattern of the contact hole depending upon information to be stored in the mask ROM. In other words, one MOS transistor is not used as one memory cell as conventionally practiced, but simply one PN junction, i.e. one diode is utilized. An area necessary for one memory cell is therefore determined by the widths of the conductive layer 43 and the polysilicon layer 42. The minimum values for the widths of the conductive layer 43 and the polysilicon layer 42 are determined by the minimum values for a line and a space in manufacturing technology available today. Reducing these widths therefore permits the area occupied by one memory cell on the substrate to be far reduced compared to conventional ones. A mask ROM having integration density far higher than in the conventional case in which an MOS transistor is used as a memory.

In the mask ROM shown in Japanese Patent Laying-Open No. 63-137471, as shown in FIG. 5, a plurality of P type diffusion layers 51 are formed parallel to each other on an N type monocrystalline silicon substrate 50. Formed on the P type diffusion layer 51 are a plurality of N type polycrystalline silicon layers 52 parallel to each other with an insulating film therebetween, and in the direction orthogonal to the P type diffusion layer 51. Contact holes are selectively formed at the crossing points of the P type diffusion layers 51 and the N type polycrystalline silicon layers 52 at that time. The P type diffusion layers 51 and the N type polycrystalline silicon layers 52 come into contact at the crossing points provided with the contact holes, thereby forming PN junctions. The presence and absence of the PN junction determines conduction and non conduction between the P type diffusion layer 51 and the N type polycrystalline silicon layer 52, so that desired information is stored in the memory cell array.

In the conventional semiconductor memory device as described above, memory cells are arranged two-dimensionally, thereby limiting high density integration. Three-dimensional arrangement of memory cells is considered for higher integration density.

In a mask ROM using an MOS transistor as a memory cell, however, the MOS transistor includes a semiconductor substrate as a part thereof, and therefore it is not possible to build them upon each other to form a multi-layered structure. Similarly, the mask ROM shown in FIG. 5 using a diode element as a memory cell uses the semiconductor substrate as a part of the memory cell, i.e. the P type diffusion layer 51 is formed by introducing a P type impurity into the silicon substrate 1, so that it was not possible to build them upon each other to make a multilayered structure.

Meanwhile, in the mask ROM shown in FIGS. 3A to 3C, the semiconductor substrate is not used as a part of the memory cell, it is possible to construct a multilayered memory cell array. In the following, a manufacturing method conceivable when multilayering the mask ROM shown in FIGS. 3A to 3C will be described in conjunction with FIGS. 4A to 4C.

An insulating film 41' is formed entirely on a mask ROM shown in FIG. 4A in which one layer of memory cell is formed. Then, the insulating film 40' is selectively provided with contact holes 44'. A plurality of strip shaped polysilicon layers 46 are formed in parallel to each other and in the direction orthogonal to the conductive layer 43 on the insulating film 41' including the contact holes 44'. A P type impurity is implanted into the contact holes 44' for forming PN junctions. A multilayered structure of mask ROMs shown in FIG. 4B is provided by these manufacturing steps.

Now, an N type impurity is implanted entirely on the mask ROM shown in FIG. 4B, and the upper portions of the polysilicon layer 46 and the polysilicon layer 45' are turned into N type. Thus, an N type polysilicon layer 42' having a different conductivity type from the word line is formed (see FIG. 4C).

The following problems are observed in a thus obtained mask ROM of multilayer structure.

When the P type polysilicon layer 45' is formed, ion implantation should be performed more deeply than the polysilicon layer 46 which is later to be the word line, and, therefore the word line is greatly damaged by the ion implantation.

Further, as can be seem from FIG. 4C, the shape of impurity a of the lower N type polysilicon layer 42 is totally different from the shape of impurity b of the upper N type polysilicon layer 42', resulting in a big difference in resistance between the upper and lower word lines. This may cause variation in accessing speed, and may prevent high speed accessing.

SUMMARY OF THE INVENTION

It is therefore an object of the present invention to provide a semiconductor memory device having high performance and extremely high integration density.

Another object of the present invention is to provide a method of manufacturing a semiconductor device, by which a memory cell array of multilayered structure using a diode element as a memory cell is fabricated without damaging elements as well as without deteriorating performance thereof.

A semiconductor memory device in accordance with the present invention having at least two layers of memory cell arrays built upon each other includes a semiconductor substrate, a plurality of first conductive layers, a plurality of second conductive layers, a plurality of first contact holes, a plurality of first PN junction means, a plurality of third conductive layers, a plurality of second contact holes, and a plurality of second PN junction means. The plurality of first conductive layers are formed on the semiconductor substrate with an insulating film therebetween, and arranged in parallel to each other. The plurality of second conductive layers are formed on the first conductive layers with an insulating film therebetween, and are arranged in parallel to each other and disposed to be crossing the first conductive layers. The plurality of first contact holes are selectively formed at crossing points of the first conductive layers and the second conductive layers, and bring the first conductive layers and the second conductive layers into contact. The plurality of first PN junction means are formed on the surface layers of the first conductive layers in contact with the first contact holes, and permit only one-way conduction in a selected direction between the first conductive layers and the second conductive layers. The plurality of third conductive layers are formed on the second conductive layers with an insulating film therebetween, and arranged in parallel to each other, crossing the second conductive layers. The plurality of second contact holes are selectively formed at the crossings of the second conductive layers and the third conductive layers, and bring the second conductive layer and the third conductive layer into contact. The plurality of second PN junction means are formed on the surface layers of the second conductive layers in contact with the second contact holes, and permit conduction in only one selected direction between the second conductive layers and the third conductive layers. The first and second conductive layers, the first contact holes, and the first PN junction means constitute the memory cell array of the first layer, and the second and third conductive layers, the second contact holes, and the second PN junction means constitute the memory cell array of the second layer.

In the present invention, diode elements are used as memory cells, and each memory cell is arranged three-dimensionally, thereby implementing an extremely highly integrated mask ROM.

The PN junctions to be the diode elements are formed in the surface layers of the first conductive layers and the surface layers of the second conductive layers at the crossing points of the two kinds of conductive layers, and, therefore, heavy ion implantation like the P type polysilicon 45' shown in FIG. 4B will not be necessary. Also the impurity shapes of the first conductive layers and the second conductive layers are not much different from each other, and there will not be variations or deterioration in accessing speed.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 3A to 3C are views schematically showing an example of a memory cell array of a conventional mask ROM using diode elements as memory cells, FIG. 3A is a plane view, FIG. 3B is a schematic view taken along line A in FIG. 3A, and FIG. 3C is a schematic view taken along line B in FIG. 3A;

DESCRIPTION OF PREFERRED EMBODIMENTS

Figure 1A:
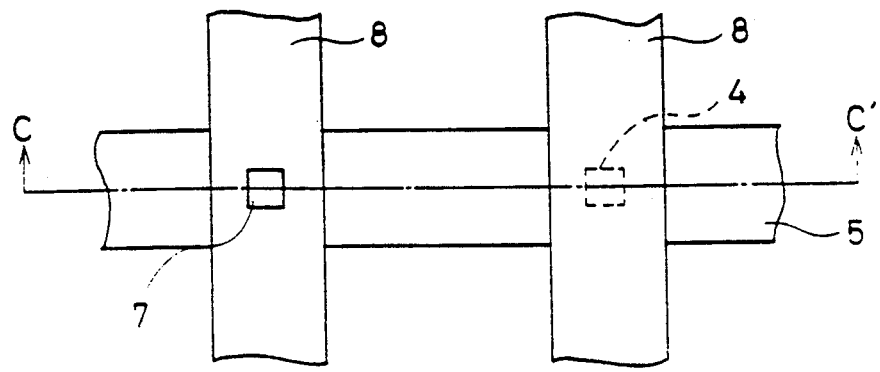
FIG. 1A is a plan view schematically showing a partial structure of a memory cell array in a mask ROM in accordance with one embodiment of the present invention.
Figure 1B:
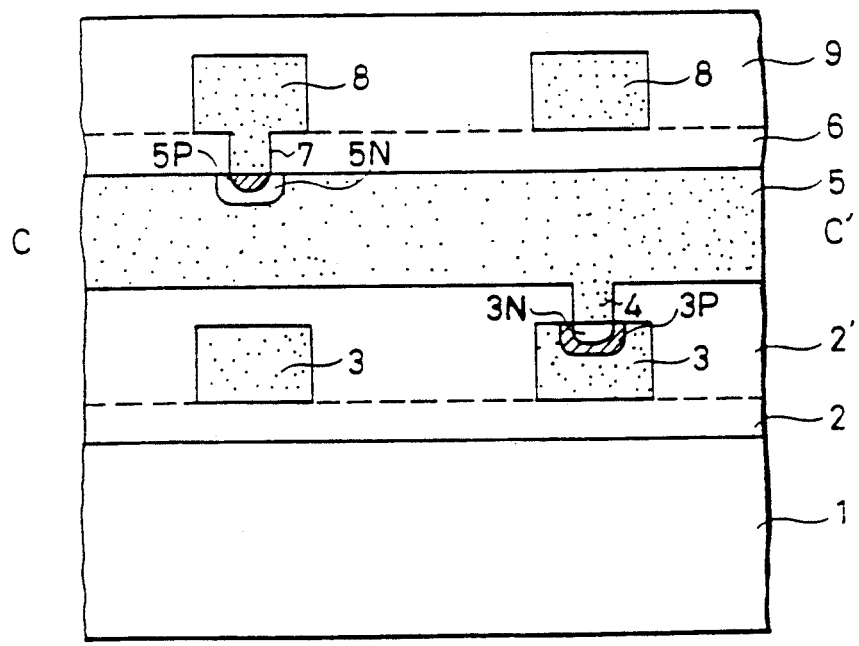
FIG. 1B is a sectional view taken along line C—C' in FIG. 1A.

FIG. 1A is a plan view of a mask ROM in accordance with one embodiment of the present invention, showing four memories. FIG. 1B is a schematic view taken along line C—C, in FIG. 1A.

Now, referring to FIGS. 1A and 1B, description will be given on a manufacturing method of the mask ROM and a structure thereof in accordance with one embodiment of the present invention. An oxide film, i.e. an insulating film 2 is formed on a monocrystalline silicon substrate 1 by a selective oxidation method, etc. Then, a plurality of strip type first polysilicon layers corresponding to bit lines (or word lines) are formed. The polysilicon layers 3 are arranged in parallel to each other. The first polysilicon layers 3 are heat treated (laser annealed) with a laser beam to be monocrystallized. A P type impurity and then an N type impurity are applied into the portions in which contact holes are opened later in the monocrystallized first polysilicon layers, to form a P type impurity region 3P and an N type impurity region 3N. A PN junction is thus formed on the surface layer of the first polysilicon layer 3. Laser annealing and monocrystallizing the first polysilicon layer 3 brings about the following effects. A high-quality PN junction is formed on the surface layer of the first polysilicon layer 3. Control of impurity implantation regions can be improved, thereby reducing an area required by the PN junction portion in the word line, so that the resistance of the word line is kept from rising.

A further interlayer insulating film 2' is formed on the insulating film 2 and the first polysilicon layer 3, and etching or the like is performed depending upon desired data in the interlayer insulating film 2', to open a contact hole 4. Then, a plurality of strip shaped second polysilicon layers 5 corresponding to word lines (or bit lines) are formed on the interlayer insulating film 2' including the contact hole 4. The second polysilicon layers 5 are arranged in parallel to each other and in the direction orthogonal to the first polysilicon layer 3. Then, the second polysilicon layer 5 is laser-annealed to be monocrystallized. The laser annealing brings about similar effects to those in the case of laser annealing the first polysilicon layer 3. An insulating film 6 is formed on the second polysilicon layer 5 and the exposed interlayer insulating film 2', thereby selectively opening a contact hole 7. A P type impurity and then an N type impurity are applied into the contact hole 7, and an N type impurity region 5N in the second polysilicon layer 5 and a P type impurity region 5P in the second polysilicon layer 5 are formed. A PN junction is thus formed on the surface layer of the second polysilicon layer 5 in contact with the contact hole 7. A plurality of strip shaped third polysilicon layers 8 corresponding to bit lines (or word lines) are formed on the insulating film 6 including the contact hole 7. The third polysilicon layers 8 are arranged in parallel to each other and in a direction orthogonal to the second polysilicon layer 5. Finally a protective film 9 for protecting the devices is formed on the third polysilicon layers 8 and the exposed insulating film 6.

In the above-described mask ROM, the first polysilicon layers 3, the contact hole 4 and the second polysilicon layer 5 constitute the memory cell array of the first layer, and the first polysilicon layer 5, the contact hole 7 and the third polysilicon layers 8 constitute the memory cell array of the second layer. PN junctions are formed at the bottoms of the contact holes 4 and 7, and electrical conduction is established between the word lines and the bit lines. Therefore, crossing points provided with the contact holes are different from crossing points without the contact holes in electrical characteristics, so that the mask ROM can store desired information in a fixed manner.

As described above, in the mask ROM in accordance with one embodiment of the present invention shown in FIGS. 1A and 1B, an area required for a PN junction is reduced by laser annealing and monocrystalining the first and second polysilicon layers 3 and 5, thereby preventing increase in resistance. The PN junction in the memory cell array of the second layer is formed on the surface layer of the second polysilicon layer 5, thereby reducing an area required for the PN junction region similarly, and reducing damages given on the third polysilicon layers 8.

Figure 2:
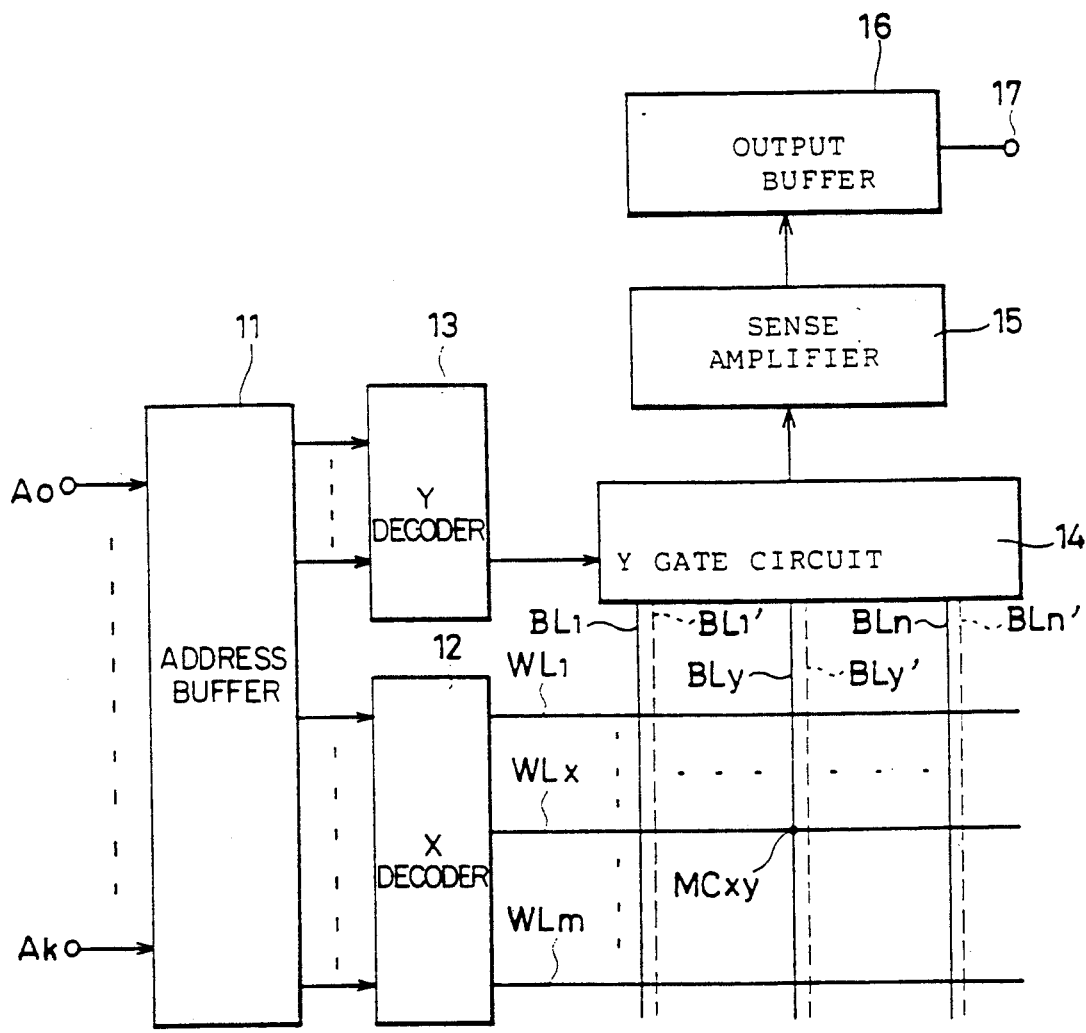
FIG. 2 is a block diagram showing a structure of a mask ROM device formed using the memory cell arrays shown in FIGS. 1A and 1B.
Figure 4A:
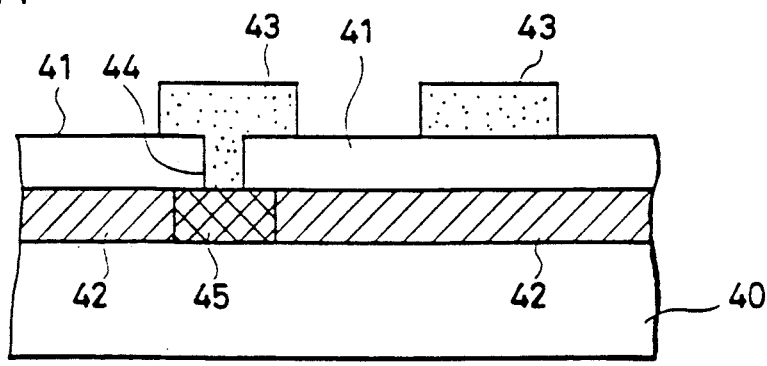
FIGS. 4A to 4C are views for illustrating a manufacturing process and a multilayer structure conceivable when the conventional mask ROM shown in FIGS. 3A to 3C is multilayered.
Figure 4B:
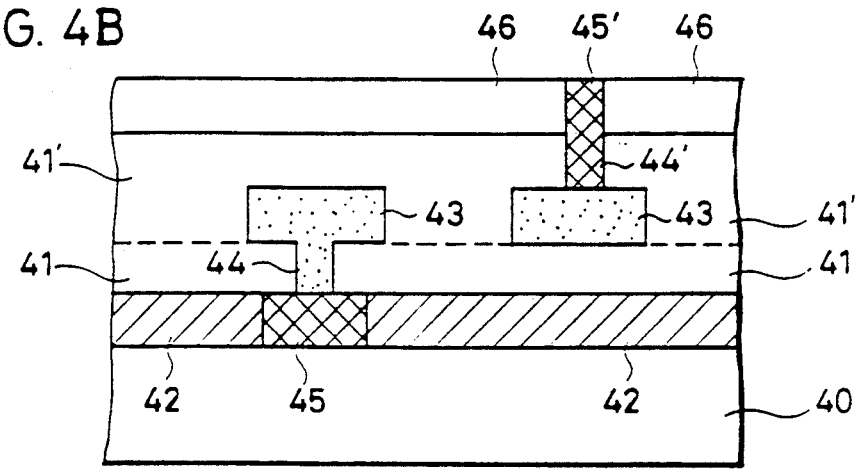
Figure 4C:
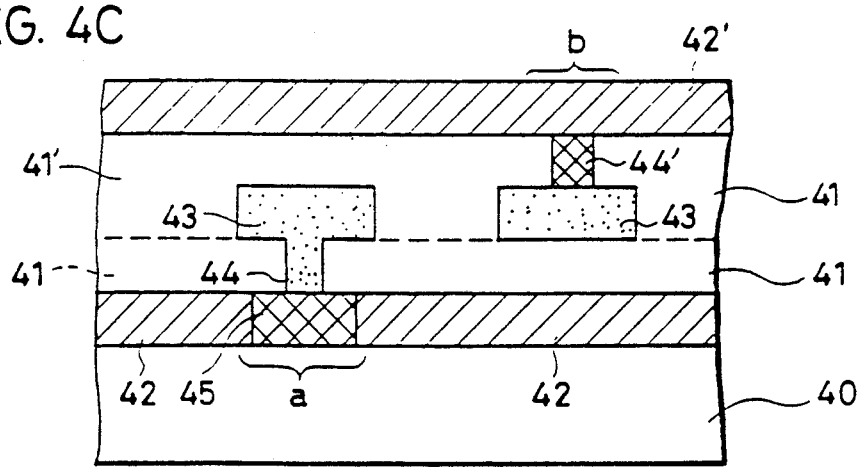
Figure 5:
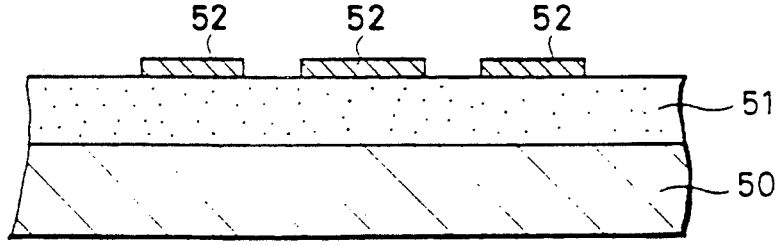
FIG. 5 is a schematic view showing another example of a memory cell array of a conventional mask ROM using diode elements as memory cells.

FIG. 2 is a block diagram showing a structure of one embodiment of a mask ROM device structured using the memory cell arrays shown in FIGS. 1A and 1B. In the figure, externally input address signals A0 to Ak are supplied to an address buffer 11. The address buffer 11 applies among the supplied address signals, X address signals to a X decoder 12 and Y address signals to a Y decoder 13. The X decoder 12 decodes the applied X address signals and selects one word line from word lines WL1 to WLm. The selected word line is set to be in an "L" level and the others in a floating state. On the other hand, the Y decoder 13 decodes the applied Y address signal to output an opening/closing control signal for a Y gate circuit 14. The Y gate circuit 14 includes a plurality of MOS transistors interposed between each of bit lines BL1, to BLn, in the memory cell array of the first layer as well as each of the bit lines BL1 to BLn in the memory cell array of the second layer, and a sense amplifier 15. The Y decoder 13 selects only one out of the plurality of MOS transistors included in the Y gate circuit 14 and conducts the same, thereby selecting one bit line from the bit lines BL1 to BLn and BL1, to BLn, The sense amplifier 15 amplifies the potential-of the selected bit line to apply the amplified potential to an output buffer 16. The output buffer 16 further amplifies the output from the sense amplifier 15 and conducts a reading signal externally from an output terminal 17. In the mask ROM device shown in FIG. 2, the word lines WL1 to WLm correspond to the second polysilicon layer 5 shown in FIG. 1B, the bit lines BL1' to BLn' correspond to the first polysilicon layers 3 in FIG. 1B, and the bit lines BL1 to BLn correspond to the third polysilicon layers 8 in FIG. 1B.

Now, in the mask ROM device shown in FIG. 2, a case is assumed in which a word line WLx and a bit line BLy are selected. In this case, a memory cell MCxy at the crossing point of the word line WLx and the bit line BLy is to be selected, and if the word line WLx and the bit line BLy are connected by a PN junction through a contact hole at the crossing point, the bit line BLy is grounded through the word line WLx and the potential of the bit line BLy is to be the ground potential. On the other hand, if no contact hole is formed at the crossing of the word line WLx and the bit line BLy, and no connection is established between them, the potential of the bit line BLy does not drop. The sense amplifier 15 detects the change in the potential of the bit line BLy and amplifies the same. The output from the sense amplifier is output externally from the output terminal 17 through the output buffer 16.

Although in the mask ROM device shown in FIG. 2, the non-selected word lines are kept in a floating state, alternatively the non-selected word lines may be set at the "H" level.

As described above, in accordance with the present invention, a semiconductor memory device having an extremely high integration density can be produced because diode elements are used as memory cells, and the memory cells are arranged three-dimensionally.

The PN junctions in the memory cell array of the second layer are formed on the surface layer of the second conductive layers before the third conductive layers are formed, and therefore it is not necessary to implant an impurity penetrating the third conductive layers, thereby preventing damages given on the elements by such impurity implantation.

The PN junctions in the memory cell array of the first layer are formed only on the surface layer of the first conductive layers, so that increase in resistance due to the formation of the PN junctions can be prevented as much as possible. As a result, no variation is observed in resistance between the first conductive layers and the third conductive layers, and, therefore, variations and deteriorations in accessing speed can be prevented.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device having at least two layers of memory cell arrays built upon each other, comprising:
   a semiconductor substrate;
   a plurality of first conductive layers formed on said semiconductor substrate with an insulating film therebetween and arranged in parallel to each other;
   a plurality of second conductive layers formed on said first conductive layers with an insulating film therebetween, said second conductive layers being arranged in parallel to each other and disposed to be crossing said first conductive layers;
   a plurality of first contact holes formed selectively at crossing points of said first conductive layer and said second conductive layers for contacting said first conductive layers and said second conductive layers;
   a plurality of first PN junction means formed on surface layers of said first conductive layers in contact with said first contact holes for permitting conduction in only one selected direction between said first conductive layer and said second conductive layers;
   a plurality of third conductive layers formed on said second conductive layers with an insulating film therebetween and arranged in parallel to each other, crossing said second conductive layers;
   a plurality of second contact holes formed selectively at the crossing points of said second conductive layers and said third conductive layers for contacting said second conductive layers and said third conductive layers; and
   a plurality of second PN junction means formed on the surface layers of said second conductive layers in contact with said second contact holes for permitting conduction in only one selected direction between said second conductive layers and said third conductive layers,
   said first and second conductive layers, said first contact holes, and said first PN junction means forming a memory cell array of a first layer,
   said second and third conductive layers, said second contact holes, and said second PN junction means forming a memory cell array of a second layer.

2. A semiconductor memory device having at least two layers of memory cell arrays built upon each other, comprising:
   a semiconductor substrate;
   a plurality of first conductive layers formed on said semiconductor substrate with an insulating film therebetween and arranged in parallel to each other;
   a plurality of second conductive layers formed on said first conductive layers with an insulating film therebetween, said second conductive layers being arranged in parallel to each other and disposed to be crossing said first conductive layers;
   a plurality of first contact holes formed selectively at crossing points of said first conductive layer and said second conductive layers for contacting said first conductive layers and said second conductive layers;
   a plurality of first PN junction means formed on surface layers of said first conductive layers in contact with said first contact holes for permitting conduction in only one selected direction between said first conductive layers and said second conductive layers;
   a plurality of third conductive layers formed on said second conductive layers with an insulating film therebetween and arranged in parallel to each other, crossing said second conductive layers;
   a plurality of second contact holes formed selectively at the crossing points of said second conductive layers and said third conductive layers for contacting said second conductive layers and said third conductive layers; and
   a plurality of second PN junction means formed on the surface layers of said second conductive layers in contact with said second contact holes for permitting conduction in only one selected direction between said second conductive layers and said third conductive layers, said first and second conductive layers, said first contact holes, and said first PN junction means forming a memory cell array of a first layer, said second and third conductive layers, said second contact holes, and said second PN junction means forming a memory cell array of a second layer, wherein said first, second and third conductive layers are each formed of strip shaped polycrystalline silicon.

3. The semiconductor memory device in accordance with claim 2, wherein the polycrystalline silicon forming said first and second conductive layers is monocrystallized.

* * * * *